US012804984B2

(12) United States Patent
Wei et al.

(10) Patent No.: US 12,804,984 B2
(45) Date of Patent: Nov. 17, 2026

(54) SEMICONDUCTOR STRUCTURE AND METHOD FOR FORMING THE SAME

(71) Applicant: Winbond Electronics Corp., Taichung City (TW)

(72) Inventors: Cheng-Hong Wei, Taichung City (TW); Tseng-Yao Pan, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 357 days.

(21) Appl. No.: 18/620,491

(22) Filed: Mar. 28, 2024

(65) Prior Publication Data

US 2025/0072081 A1 Feb. 27, 2025

(30) Foreign Application Priority Data

Aug. 24, 2023 (TW) ................................ 112131826

(51) Int. Cl.
*H10D 64/01* (2025.01)
*H10B 12/00* (2023.01)

(52) U.S. Cl.
CPC ......... *H10D 64/021* (2025.01); *H10B 12/488* (2023.02); *H10D 64/015* (2025.01)

(58) Field of Classification Search
CPC .... H10B 12/00; H10B 12/053; H10B 12/488; H10B 41/27; H10B 41/30; H10B 41/35; H10B 41/40; H10B 43/27; H10D 64/01; H10D 84/0126; H10D 64/015; H10D 64/021; H10D 84/038; H10P 50/00; H10P 50/691; H10P 50/71; H10P 76/40; H10P 76/4085; H10P 76/4088; G11C 5/025
See application file for complete search history.

(56) References Cited

U.S. PATENT DOCUMENTS

2012/0156866 A1* 6/2012 Ahn ........................ H10B 41/35
257/E21.409
2016/0365311 A1* 12/2016 Hung ...................... H10P 50/71
2021/0358764 A1* 11/2021 Wu ......................... H10P 50/71

FOREIGN PATENT DOCUMENTS

| | | | |
|---|---|---|---|
| CN | 111524793 | A | 8/2020 |
| TW | I734530 | B | 7/2021 |
| TW | I804360 | B | 6/2023 |

* cited by examiner

*Primary Examiner* — Brook Kebede
(74) *Attorney, Agent, or Firm* — Birch, Stewart, Kolasch & Birch, LLP

(57) ABSTRACT

A method for forming a semiconductor structure is provided. The method includes providing a substrate with a word line region and a select gate region adjacent to each other, sequentially forming a stack layer and a hard mask layer on the substrate, and forming patterned mandrels on the hard mask layer. The method includes forming sidewall spacers on the patterned mandrels, and forming a patterned photoresist over the select gate region. The method further includes sequentially patterning the hard mask layer and the stack layer to form word lines in the word line region and a select gate in the select gate region, respectively. There is a first spacing between the word lines, and a second spacing between the select gate and the first word line of the word lines closest to the select gate. The second spacing is greater than the first spacing.

20 Claims, 8 Drawing Sheets

SEMICONDUCTOR STRUCTURE AND METHOD FOR FORMING THE SAME

CROSS REFERENCE TO RELATED APPLICATIONS

This Application claims priority of Taiwan Patent Application No. 112131826 filed on Aug. 24, 2023, the entirety of which is incorporated by reference herein.

BACKGROUND OF THE INVENTION

Field of the Invention

The present disclosure relates to a semiconductor process technology, and in particular to a semiconductor structure formed by a self-aligned multi-patterning process and a method for forming the same.

Description of the Related Art

With the advancement of technology, all kinds of electronic products are following the trend of becoming lighter, thinner, shorter and smaller with each successive generation. However, as the dimensions of the components are continuously being scaled down, numerous challenges also arise. In a conventional lithography process, the reduction of critical dimensions includes the use of optical elements with larger numerical apertures (NA), shorter exposure wavelengths (e.g., extreme ultraviolet (EUV)), and the use of interface materials other than air (e.g., water immersion). As the resolution of conventional lithography processes approaches their theoretical limit, vendors have turned to methods such as double-patterning (DP) and quadruple-patterning (QP) to overcome the optical limit and increase the integration of memory elements.

In the current patterning method, the pattern transferring process of the select gate may affect the line width of the word line closest to the select gate, resulting in structural damage or breakage of the word line, thereby affecting the isolation of the memory array region, and impacting electrical performance. Therefore, the industry still needs to improve the method of forming semiconductor structures to achieve the desired goal of maintaining the yield of the memory device.

BRIEF SUMMARY OF THE INVENTION

An embodiment of the present disclosure provides a method for forming a semiconductor structure. The method includes providing a substrate with a word line region and a select gate region adjacent to each other and sequentially forming a stack layer and a hard mask layer on the substrate. The method further includes forming a plurality of patterned mandrels on the hard mask layer and forming a plurality of sidewall spacers on opposite sidewalls of the patterned mandrels. The distance between the two closest patterned mandrels at the intersection of the word line region and the select gate region is less than the distance between the patterned mandrels in the word line region. The method further includes forming a patterned photoresist over the select gate region, and using the sidewall spacers and the patterned photoresist as a mask, sequentially patterning the hard mask layer and the stack layer to form a plurality of word lines in the word line region and a select gate in the select gate region, respectively. There is a first spacing is between the word lines. There is a second spacing is between the select gate and the first word line of the word lines closest to the select gate. The second spacing is greater than the first spacing.

In some embodiments, the forming of the sidewall spacers includes forming a plurality of first spacers on opposite sidewalls of the patterned mandrels, and forming a first merged spacer between the two closest patterned mandrels adjacent to the word line region and the select gate region. The forming of the sidewall spacers further includes removing the patterned mandrels to leave the first spacers and the first merged spacer on the hard mask layer. The forming of the sidewall spacers further includes sequentially transferring a pattern of the first spacers and the first merged spacer to the hard mask layer and the stack layer to form the word lines and the select gate. The portion of the stack layer corresponding to the first spacers and the first merged spacer in the word line region is formed as the word lines and the first word line, respectively. The portion of the stack layer corresponding to the patterned photoresist in the select gate region is formed as the select gate.

In some embodiments, the ratio of the width of the first merged spacer to the width of the first spacers is greater than 1 but not greater than 2. A height of the patterned photoresist is greater than a height of the first spacers and a height of the first merged spacer. The width of the first word line is greater than the width of any of the other word lines.

In some embodiments, the forming of the sidewall spacers includes forming a plurality of first spacers on opposite sidewalls of the patterned mandrels, and forming a first merged spacer between the two closest patterned mandrels adjacent to the word line region and the select gate region. The forming of the sidewall spacers further includes removing the patterned mandrels to leave the first spacers and the first merged spacer on the hard mask layer. The forming of the sidewall spacers further includes forming a plurality of second spacers on opposing sidewalls of the first spacers and the first merged spacer, and forming a second merged spacer between the first merged spacer and a closest of the first spacers in the word line region. The forming of the sidewall spacers further includes removing the first spacers and the first merged spacer to leave the second spacers and the second merged spacer on the hard mask layer. The forming of the sidewall spacers further includes sequentially transferring a pattern of the second spacers and the second merged spacer to the hard mask layer and the stack layer to form the word lines and the select gate. The portion of the stack layer corresponding to the second spacers and the second merged spacer in the word line region is formed as the word lines and the first word line, respectively. The portion of the stack layer corresponding to the patterned photoresist in the select gate region is formed as the select gate.

In some embodiments, the ratio of the width of the second merged spacer to the width of the second spacers is greater than 1 but not greater than 2. The height of the patterned photoresist is greater than the height of the second spacers and the height of the second merged spacer. The first word line is separated from the select gate by the width of the first merged spacer. The width of the first merged spacer is equal to the width of the second merged spacer. In some embodiments, the patterned photoresist exposes a portion of the second spacers.

In some embodiments, before the forming of the hard mask layer on the stack layer, the method further includes forming a sacrificial layer on the stack layer. The sacrificial layer protects the stack layer from etching during the transferring of the pattern of the second spacers and the second merged spacer to the hard mask layer. The hard mask layer comprises polycrystalline silicon. The sacrificial layer comprises silicon oxide. The width of the first word line is equal to the second spacing.

An embodiment of the present disclosure provides a semiconductor structure. The semiconductor structure includes a substrate and a plurality of word lines disposed on the substrate. The word lines extend in a first direction and are arranged in a second direction, and the first direction intersects the second direction. The semiconductor structure further includes a select gate disposed on the substrate, adjacent to and spaced apart from the word lines in the second direction. There is a first spacing is between the word lines. There is a second spacing is between the select gate and the first word line of the word lines closest to the select gate. The second spacing is greater than the first spacing.

In some embodiments, the width of the first word line is greater than the width of any of the other word lines. The width of the first word line is equal to the second spacing.

In some embodiments, the ratio of the width of the first word line to the width of any of the other word lines is greater than 1 but not greater than 2. The ratio of the second spacing to the width of any of the other word lines other than the first word line is greater than 1 but not greater than 2. The ratio of the second spacing to the first spacing is greater than 1 but not greater than 2. The ratio of the width of the first word line to the first spacing is greater than 1 but not greater than 2.

DETAILED DESCRIPTION OF THE INVENTION

Figure 1:
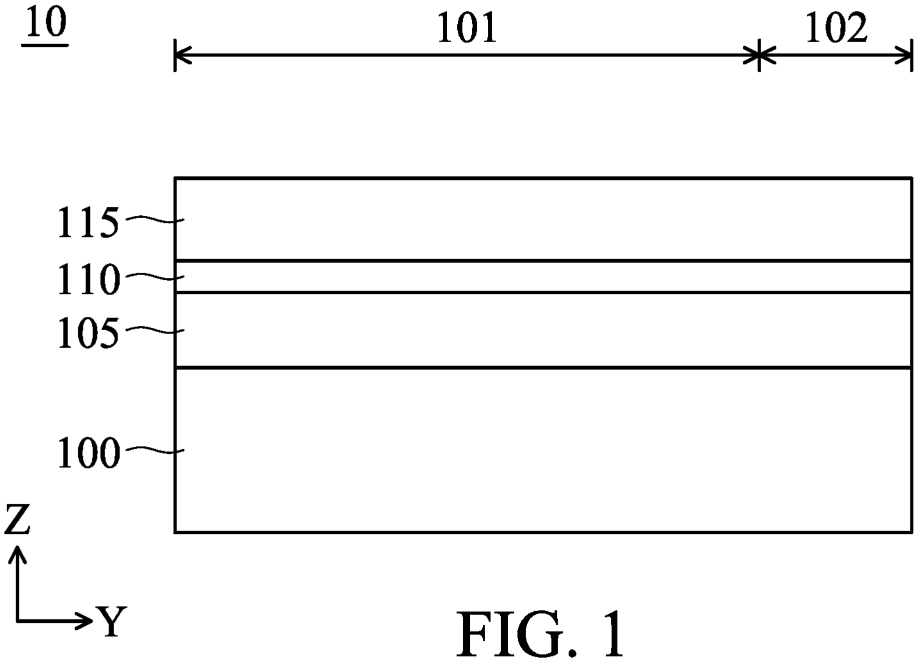
FIGS. 1 to 6 illustrate cross-sectional views of the semiconductor structure at various manufacturing stages according to the first embodiment of the present disclosure.

FIGS. 1 to 6 illustrate cross-sectional views of the semiconductor structure 10 at various manufacturing stages according to the first embodiment of the present disclosure. Referring first to FIG. 1, in some embodiments, a substrate 100 is provided. The substrate 100 has a word line region 101 and a select gate region 102 adjacent to the word line region 101.

Referring to FIG. 1, a stack layer 105, a sacrificial layer 110, and a hard mask layer 115 are sequentially formed on the substrate 100. First, the stack layer 105 is formed on the substrate 100. The stack layer 105 is a film stacked in the direction Z, with the direction Z being a normal direction perpendicular to the main surface of the substrate 100. The stack layer 105 may sequentially include, in the direction Z from bottom to top, for example, a tunnel dielectric layer, a floating gate layer, an inter-gate dielectric layer, a control gate layer, a metal layer, and the top capping layer. For the sake of simplicity, each of the layers mentioned above is not shown in detail and is only shown schematically by the stack layer 105. The material of the tunnel dielectric layer may be silicon oxide. The material of the patterned floating gate layer may be a conductive material, such as doped polysilicon, undoped polysilicon, or a combination thereof. In some embodiments, the inter-gate dielectric layer may be a composite layer constructed by, for example, oxide/nitride/oxide (ONO), but the present disclosure is not limited to it, the composite layer may include five or more layers of films. The material of the control gate layer may be a conductive material, such as doped polysilicon, undoped polysilicon, or a combination thereof. The material of the metal layer may be such as W, TiN, or a combination thereof. The material of the top capping layer may be a dielectric material, such as silicon nitride, silicon oxynitride, or a combination thereof.

Next, the sacrificial layer 110 and the hard mask layer 115 are sequentially formed on the stack layer 105. The sacrificial layer 110 protects the stack layer 105 from the etching process during the subsequent patterning process of the hard mask layer 115. The hard mask layer 115 may serve as a patterned mask for the stack layer 105 in subsequent process steps to form the word lines 200 and the select gate 300, as will be described in more detail below. The material of the sacrificial layer 110 includes silicon oxide. The hard mask layer 115 may be a single-layer or multi-layer structure. The material of the hard mask layer 115 includes polysilicon (poly-Si).

Figure 2:
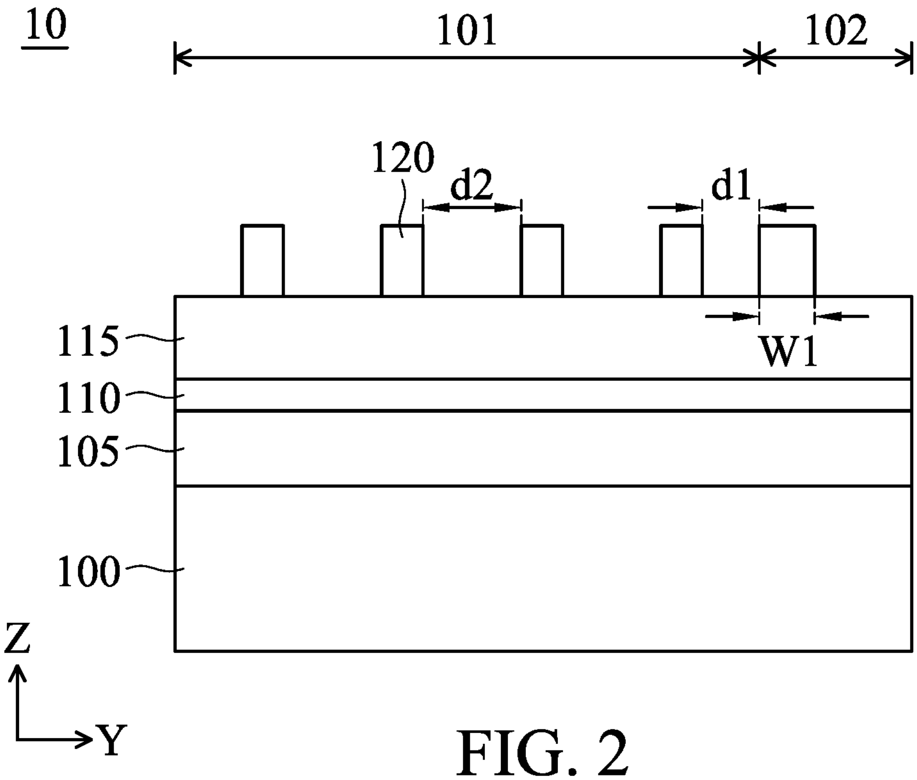

Referring to FIG. 2, in the first embodiment, a plurality of patterned mandrels 120 are formed on the hard mask layer 115. The distance d1 between two closest patterned mandrels 120 at the intersection of the word line region 101 and the select gate region 102 is less than the distance d2 between the patterned mandrels 120 in the word line region 101, as shown in FIG. 2. Generally, in the patterning process for forming the word line and the select gate, the patterned mandrels with fixed spacing are usually formed. After the pattern transferring process of the patterned mandrels is performed, the pattern is separated into the pattern of the word line and the pattern of the select gate by a separate patterning process. Therefore, during the pattern transferring process, the pattern of the first word line closest to the pattern of the select gate is susceptible to additional plasma damage, and the subsequent formation of the first word line may suffer from unstable structure or breakage. Compared to the conventional technology, the embodiments of the present disclosure, in the step of forming the patterned mandrel 120, first form the patterned mandrel 120 in the select gate region 102 to a larger width (e.g., form the patterned mandrel 120 in the select gate region 102 to the width W1), so that the pattern of the first word line may have a larger distance from the pattern of the select gate. In addition, the patterned mandrels 120 are formed with different spacing (e.g., d1<d2) in the word line region 101 and the select gate region 102 to form a merged spacer with a larger width (i.e., corresponding to the pattern of the first word line) in a subsequent process. This reduces additional damage to the pattern of the first word line from the plasma of the pattern transferring process and effectively improves the problem of unstable structure or breakage of the first word line.

In embodiments of the present disclosure, the patterned mandrel 120 may be used in a subsequent process to perform a self-aligned double patterning (SADP) process or a self-aligned quadruple patterning (SAQP) process, which will be illustrated below, starting with the self-aligned double patterning process. The patterned mandrel 120 is formed by first forming a mandrel layer (not shown) on the hard mask layer 115 and forming a photoresist pattern on the mandrel layer by photolithography and etching processes, followed by an etching process to transfer the photoresist pattern to the mandrel layer to form the patterned mandrel 120. The material of the patterned mandrel 120 may include carbon, silicon oxynitride (SiON), bottom anti-reflective coating (BARC), or a combination thereof.

Figure 3:
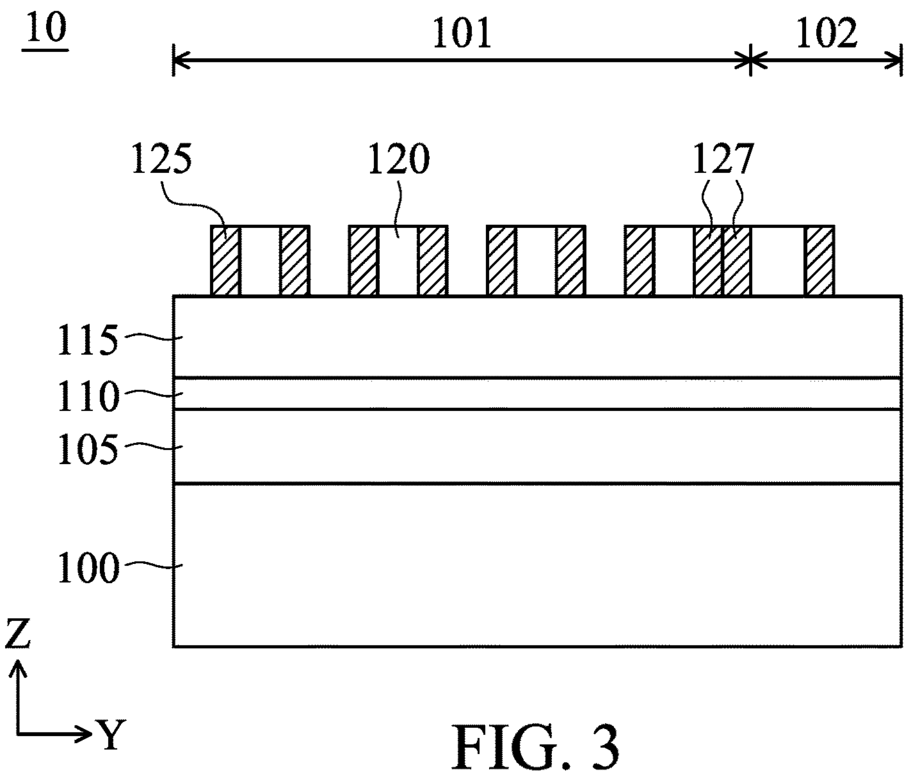

Referring to FIG. 3, after forming the patterned mandrel 120, a SADP process is performed to form a plurality of first spacers 125 on opposing sidewalls of the patterned mandrel 120 and to form a first merged spacer 127 between the two patterned mandrels 120 that are abutting each other in the word line region 101 and in the select gate region 102. The self-aligned dual patterning process comprises conformally forming a first spacer material layer (not shown) on the hard mask layer 115 as well as on the patterning mandrel 120. The material of the first spacer material layer may be an oxide such as silicon oxide ($SiO_x$). After forming the first spacer material layer, an etching-back process is performed on the first spacer material layer until a top surface of the patterned mandrel 120 and a portion of the top surface of the hard mask layer 115 are exposed. This forms a first spacer 125 on opposite sidewalls of the patterned mandrel 120, and a first merged spacer 127 is formed between the two patterned mandrels 120 adjacent to each other in the word line region 101 and the select gate region 102. The ratio of the width of the first merged spacer 127 to the width of the first spacers 125 is greater than 1 but not greater than 2. It should be noted that if the ratio of the width of the first merged spacer 127 to the width of the first spacers 125 is greater than 2, it may be more difficult to form the first merged spacer 127.

Figure 4:
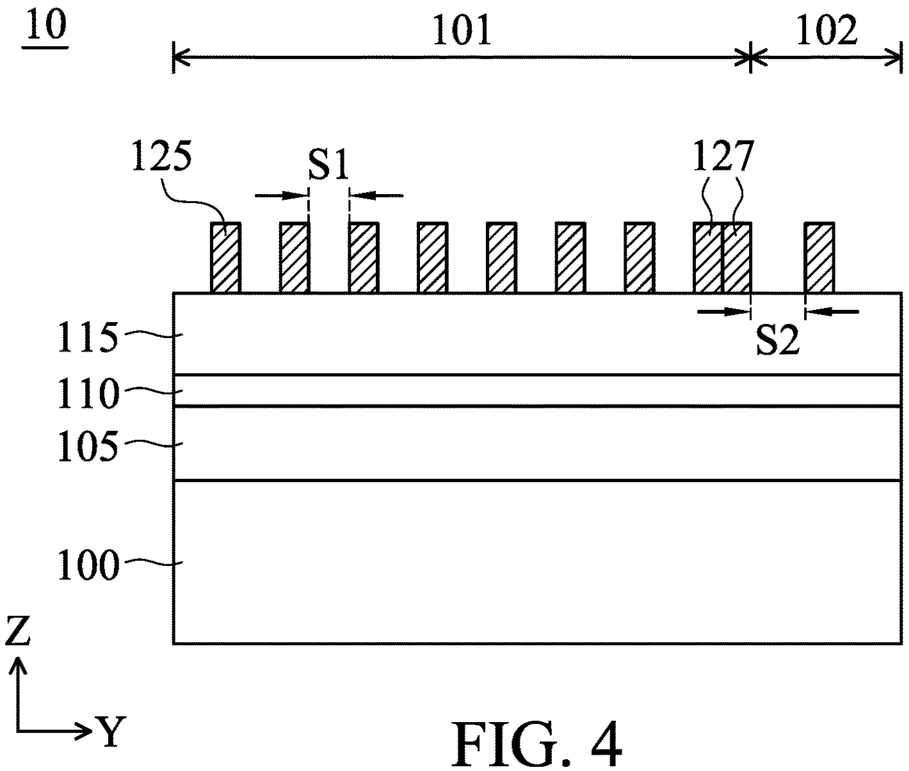

Referring to FIG. 4, the patterned mandrel 120 is removed to leave the first spacers 125 and the first merged spacer 127 on the hard mask layer 115. In the first embodiment, after removing the patterned mandrel 120, the pattern of the first spacer 125 and the first merged spacer 127 may then be sequentially transferred to the hard mask layer 115 and the stack layer 110 to form the word lines 200 and the first word line 200' closest to the select gate 300. In the second embodiment, after the removal of the patterning mandrel 120, the SAQP process may continue, as will be described in more detail later. In the first embodiment, after the removal of the patterned mandrel 120, a first spacing S1 is between the first spacer 125 in the word line region 101 that remains on the hard mask layer 115, which is substantially the first spacing S1 between the word lines 200 that are subsequently formed in the word line region 101. In the first embodiment, a second spacing S2 is between the first merged spacer 127 and the first spacers 125 in the select gate region 102, which is substantially the second spacing S2 between the subsequently formed first word line 200' and the select gate 300. The patterned mandrel 120 may be removed by using an etching process, a strip process, an ashing process, or a combination thereof, as previously described.

Figure 5:
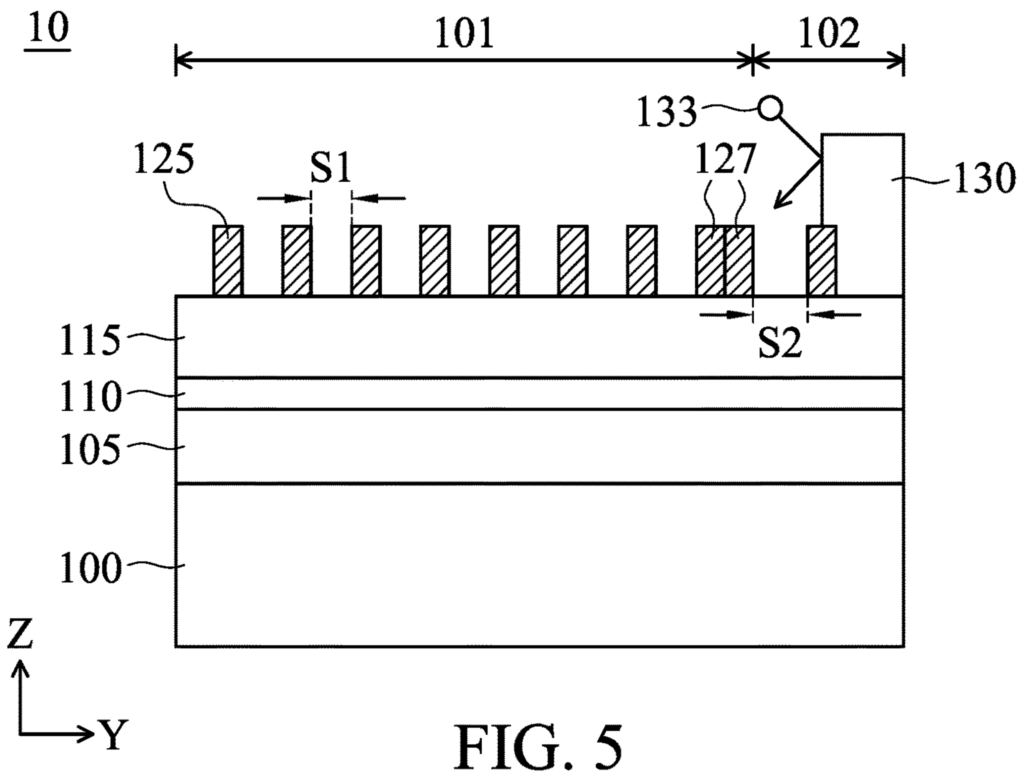

Referring to FIG. 5, a patterned photoresist 130 is formed over the select gate region 102. The patterned photoresist 130 may be used to define a pattern of a subsequently formed select gate 300 in the select gate region 102. In some embodiments, the patterned photoresist 130 may partially cover the first spacer 125 on the select gate region 102 closest to the word line region 101, and expose a portion of this first spacer 125. This helps to avoid the possible alignment shifts between the patterned photoresist 130 and the first spacer 125 on the select gate region 102 due to the pattern overlap, thereby ensuring that the select gate 300 may be formed to a desired width. The distance between the patterned photoresist 130 and the first merged spacer 127 may be substantially equal to the second spacing S2. The height of the patterned photoresist 130 is greater than the height of the first spacers 125 and the first merged spacer 127, which helps reduce etching damage to the first spacer 125 and the first merged spacer 127 during the formation of the patterned photoresist 130.

Continuing referring to FIG. 5, in a subsequent pattern transferring process, plasma ions 133 may be reflected off and bombard the first merged spacer 127 through the sidewalls of the patterned photoresist 130. This may cause the first merged spacer 127 (i.e., corresponding to the subsequent formation of the pattern of the first word line 200') to suffer from an additional bombardment of ions. However, in the embodiment of the present disclosure, the distance d1 between the closest two patterning mandrels 120 at the intersection of the word line region 101 and the select gate region 102 is reduced to form a first merged spacer 127 with a larger width. That is, let the two adjacent first spacers 125 abutting each other and merging together. Therefore, the process window of subjecting the first merged spacer 127 to the bombardment of the plasma ions 133 may be increased and may maintain the integrity of the pattern of the first word line 200'. It should be noted that in the first embodiment, the distance between the first merged spacer 127 and the patterned photoresist 130 is also increased by increasing the width WI of the patterned mandrel 120 located in the select gate region 102 (i.e., equivalent to increasing the second spacing S2 between the first word line 200' and the select gate 300), which helps to reduce the possibility of the plasma ions 133 bombarding the first merged spacer 127, thereby maintaining the pattern integrity of the first word line 200'.

Figure 6:
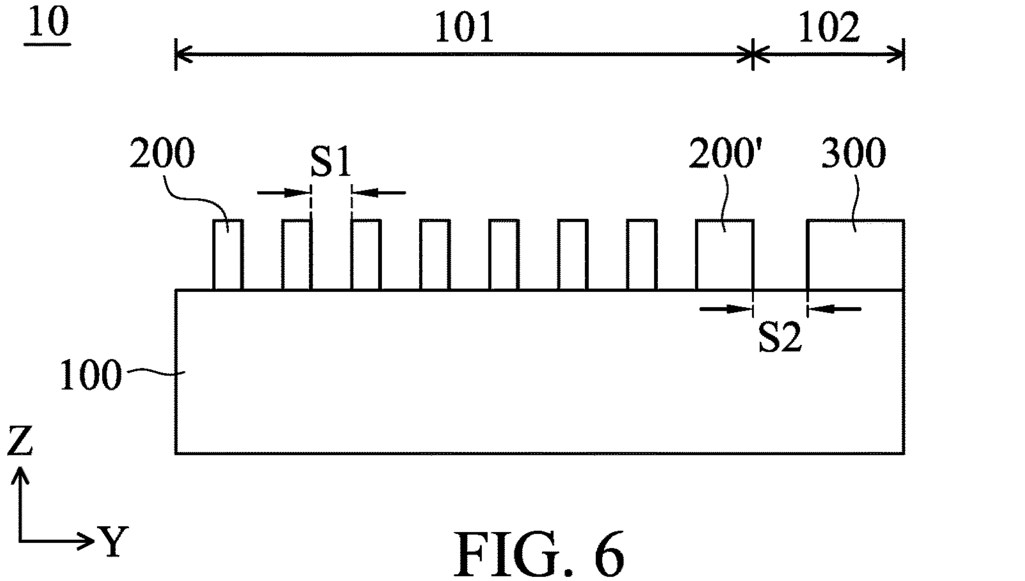

Referring to FIGS. 5 and 6, using the first spacer 125, the first merged spacer 127, and the patterned photoresist 130 as a mask, the pattern of the first spacer 125 and the first merged spacer 127 are sequentially transferred to the hard mask layer 115 and the stack layer 105 to form the word lines 200 and the first word line 200'. At the same time, the pattern of the patterned photoresist 130 is sequentially transferred to the hard mask layer 115 and the stack layer 105 to form the select gate 300. The first word line 200' is the first word line of the word lines 200 closest to the select gate 300. In other words, the portion of the stack layer 105 corresponding to the first spacer 125 and the first merged spacer 127 in the word line region 101 is formed as the word lines 200 and the first word line 200', respectively. The portion of the stack layer 105 corresponding to the patterned photoresist 130 in the select gate region 102 is formed as the select gate 300. A first spacing S1 is between the word lines 200, the first spacing S1 may correspond to the spacing between the first spacers 125 in the word line region 101, and may also correspond to the width of the patterned mandrel 120 in the word line region 101. A second spacing S2 is between the first word line 200' and the select gate 300, the first word line 200' is the word lines 200 closest to the select gate 300, and the second spacing S2 may correspond to the width W1 of the patterned mandrel 120 in the select gate region 102. The second spacing S2 is greater than the first spacing S1. The width of the first word line 200' is greater than the width of any of the other word lines 200. The width of the first word line 200' may be equal to the second spacing S2.

Figure 7:
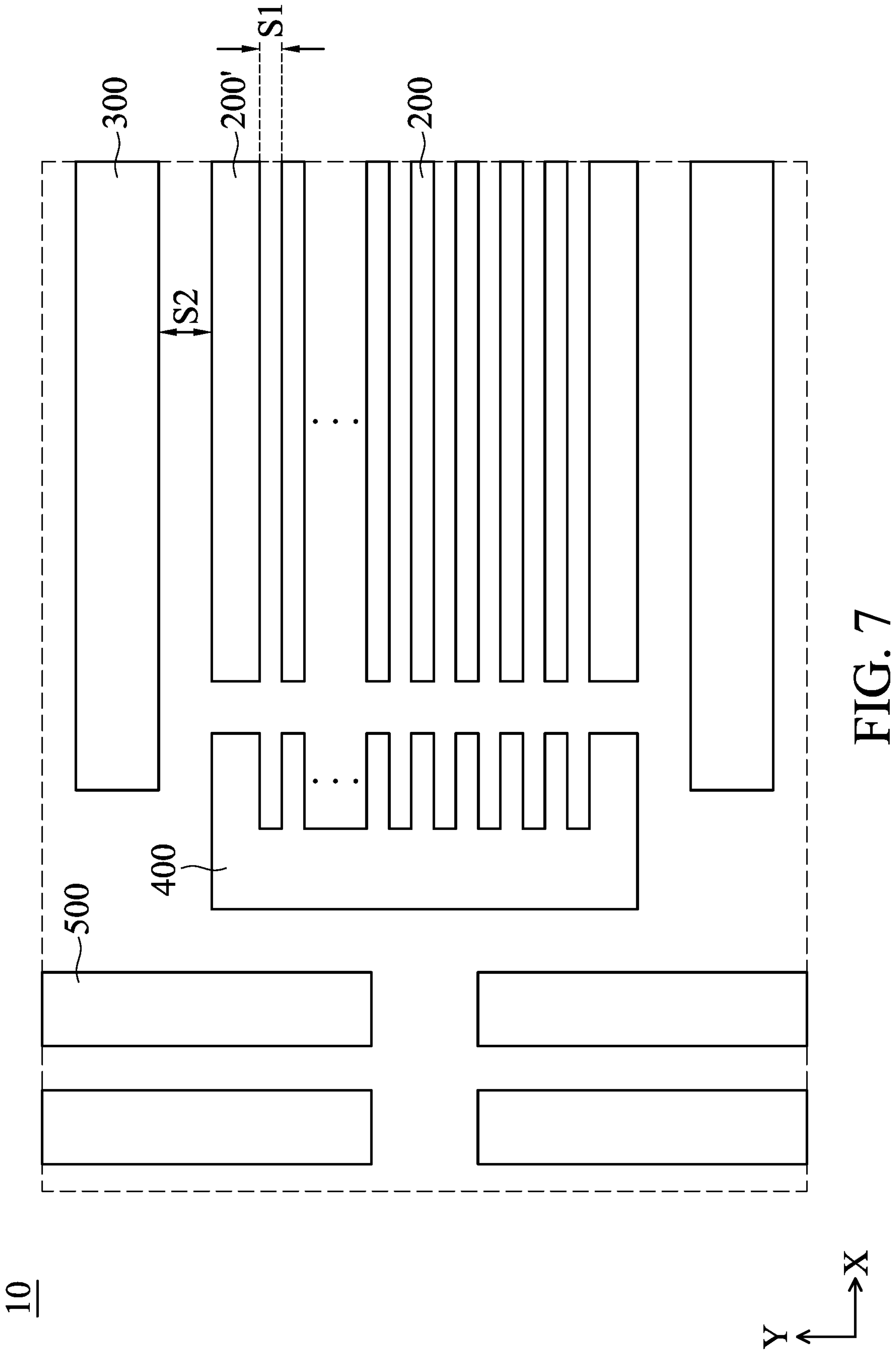
FIG. 7 illustrates a fragmentary top view of the semiconductor structure according to the first embodiment of the present disclosure.

FIG. 7 illustrates a fragmentary top view of the semiconductor structure 10 according to the first embodiment of the present disclosure. The semiconductor structure 10 further includes a dummy structure 400 and a plurality of landing pads 500. The formation of the dummy structure 400 prevents the end portions of the word lines 200 from being subjected to uneven widths due to the etching loading effects. The landing pad 500 may serve as a pick up point for the word lines 200 and connect to additional plurality of word lines 200 (not shown). The word lines 200 extend along a first direction (e.g., direction X) and are arranged along a second direction (e.g., direction Y), and the first direction intersects with the second direction. The select gate 300 is disposed adjacent to and spaced apart from the word lines 200 in the second direction (e.g., direction Y), and the select gate 300 is disposed on both sides of the word lines 200 in the second direction. As previously described, a first spacing S1 is between the word lines 200, and a second spacing S2 is between the first word line 200' and the select gate, first word line 200' is the word lines 200 closest to the select gate 300. The second spacing S2 is greater than the first spacing S1, as shown in FIG. 7. The ratio of the width of the first word line 200' to the width of any of the other word lines 200 is greater than 1 but not greater than 2. The ratio of the width of the second spacing S2 to the width of any of the other word lines 200 other than the first word line 200' is greater than 1 but not greater than 2. The ratio of the second spacing S2 to the first spacing S1 is greater than 1 but not greater than 2. The ratio of the width of the first word line 200' to the first spacing S1 is greater than 1 but not greater than 2. After the formation of the word lines 200, the first word line 200', the select gate 300, the dummy structure 400, and the landing pad 500, semiconductor processes such as various deposition, lithography, etching, and the like may be performed continuously. Subsequent processes may be used to form other related features of the memory device such as the capacitor contact window, the bit line, and the like, which will not be described further herein.

Figure 8:
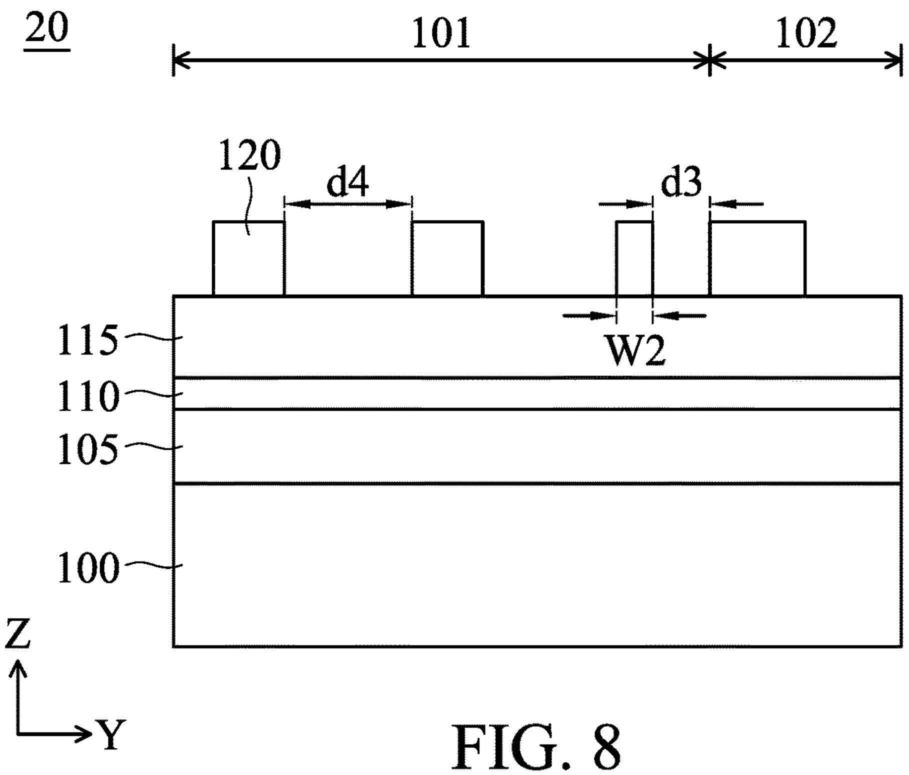
FIGS. 8 to 14 illustrate cross-sectional views of the semiconductor structure at various manufacturing stages according to the second embodiment of the present disclosure.

FIGS. 8 to 14 illustrate cross-sectional views of the semiconductor structure 20 at various manufacturing stages according to the second embodiment of the present disclosure. Similar to the first embodiment, FIGS. 1 to 6 are examples of performing the SADP process, and FIGS. 8 to 14 are examples of performing the SAQP process. Referring to FIG. 8, similar to the first embodiment, a stack layer 105, a sacrificial layer 110, and a hard mask layer 115 are sequentially formed on the substrate 100, and a plurality of patterned mandrels 120 are formed on the hard mask layer 115. The stack layer 105, the sacrificial layer 110, the hard mask layer 115, and the patterned mandrel 120 in the second embodiment are similar to the first embodiment and are not described herein repeatedly. There is a distance of d3 between the two closest patterned mandrels 120 at the intersection of the word line region 101 and the select gate region 102. There is a distance of d4 between the patterned mandrels 120 in the word line region 101. The distance d3 is less than the distance d4, as shown in FIG. 8. The distance between the subsequently formed first word line 200' and the select gate 300 is also controlled by varying the spacing (i.e., the distance d3) of the patterned mandrel 120 in the word line region 101 and the select gate region 102, as will be described in more detail later. It should be noted that in the second embodiment, the width of the first word line 200' that is subsequently formed is controlled by controlling the width W2 of the patterned mandrel 120 that is closest to the select gate region 102 in the word line region 101, as will be described in more detail hereinafter. The material of the patterned mandrel 120 may include carbon, silicon oxynitride (SiON), bottom anti-reflective coating (BARC) layer, or a combination thereof.

Figure 9:
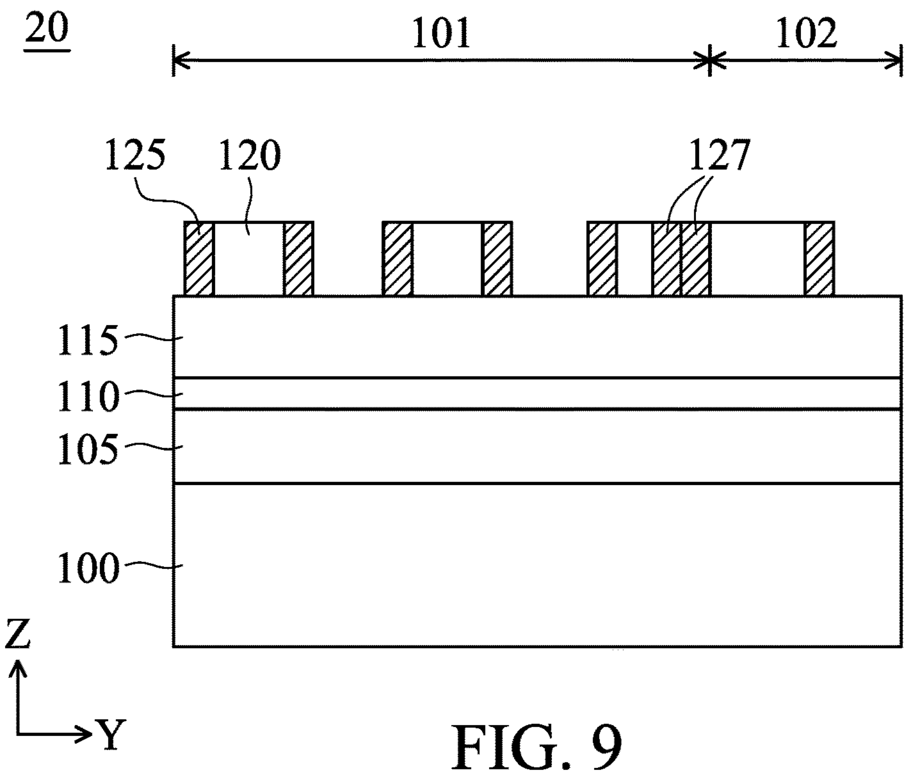

Referring to FIG. 9, similar to the first embodiment, after the formation of the patterned mandrel 120, a plurality of first spacers 125 are first formed on opposing sidewalls of the patterned mandrel 120. Then, a first merged spacer 127 is formed between the two patterned mandrels 120 that are adjacent to each other in the word line region 101 and the select gate region 102. Similar to the first embodiment, the formation of the first spacer 125 and the first merged spacer 127 may include conformally forming a first spacer material layer (not shown) on the hard mask layer 115 as well as on the patterned mandrel 120. After the formation of the first spacer material layer, an etching back process is performed on the first spacer material layer until a top surface of the patterned mandrel 120 and a portion of the top surface of the hard mask layer 115 are exposed. This forms the first spacer 125 on opposing sidewalls of the patterned mandrel 120 and forms a first merged spacer 127 between the two patterned mandrels 120 adjacent to each other in the word line region 101 and the select gate region 102. In some embodiments, the ratio of the width of the first merged spacer 127 to the width of the first spacer 125 is greater than 1 but not greater than 2. It should be noted that if the ratio of the width of the first merged spacer 127 to the width of the first spacer 125 is greater than 2, it may be more difficult to form the first merged spacer 127.

It should be noted that in the second embodiment, the width of the first merged spacer 127 is varied by controlling the distance d3 between the two closest patterned mandrels 120 at the intersection of the word line region 101 and the select gate region 102. That is, making the two closest first spacers 125 adjacent to each other and merging to form the first merged spacer 127 to increase the distance between the first word line 200' and the select gate 300 that are subsequently formed (e.g., the fourth spacing S4).

Figure 10:
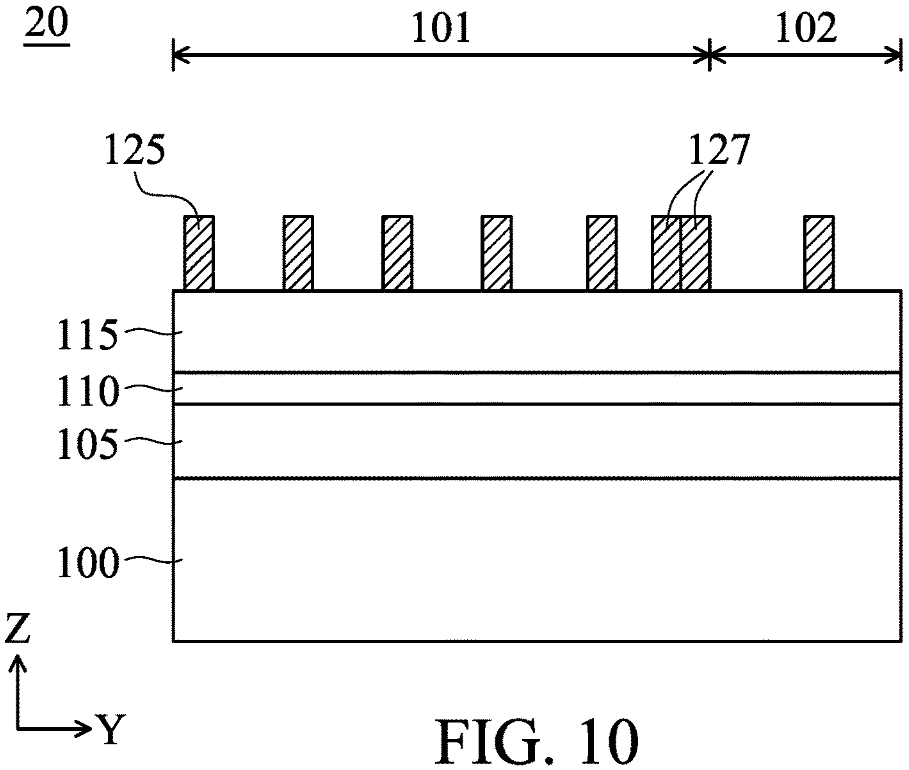

Referring to FIG. 10, the patterned mandrel 120 is removed to leave the first spacer 125 and the first merged spacer 127 on the hard mask layer 115. The patterned mandrel 120 may be removed by using the previously described etching process, stripping process, ashing process, or a combination thereof. In contrast to the first embodiment, after removing the patterned mandrel 120, the second embodiment will continue with the SAQP process. In the second embodiment, after the removal of the patterned mandrel 120, the distance between the first merged spacer 127 and the closest first spacer 125 in the word line region 101 is substantially the foregoing width W2 of the patterned mandrel 120 closest to the select gate 102 in the word line region 101.

Figure 11:
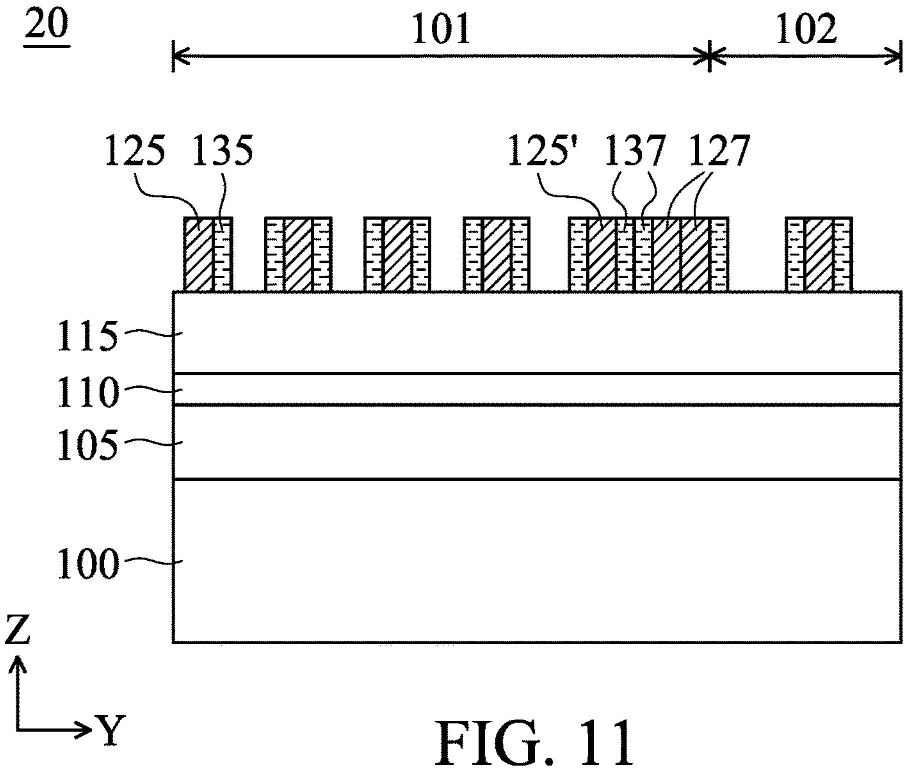

Referring to FIG. 11, after removing the patterned mandrel 120, using the first spacer 125 and the first merged spacer 127 as a mandrel, a plurality of second spacers 135 are formed on opposing sidewalls of the first spacer 125 and the first merged spacer 127. A second merged spacer 137 is formed between the first merged spacer 127 and the closest first spacer 125' in the word line region 101, i.e., the two second spacers 135 are adjacent to each other and are merged to form the second merged spacer 137. The second spacer 135 and the second merged spacer 137 may be formed by using a method similar to the method used to form the first spacer 125 and the first merged spacer 127. The difference, however, is that the second spacer 135 and the second merged spacer 137 may use a material with different etching selectivity than the first spacer 125 and the first merged spacer 127. This may enable to selectively remove the first spacer 125 and the first merged spacer 127 but not the second spacer 135 and the second merged spacer 137 in the subsequent process. The width of the first merged spacer 127 is equal to the width of the second merged spacer 137. In the second embodiment, the material of the first spacer 125 and the first merged spacer 127 may include silicon oxide, silicon nitride, and polycrystalline silicon, while the material of the second spacer 135 and the second merged spacer 137 may include silicon oxide, silicon nitride, and polycrystalline silicon. It should be noted that in some embodiments, the first spacer 125, the first merged spacer 127, the second spacer 135, and the second merged spacer 137 may have different materials, respectively, but the materials may be interchangeable. For example, if the material of the first spacer 125 and the first merged spacer 127 is polycrystalline silicon, the material of the second spacer 135 and the second merged spacer 137 is silicon oxide or silicon nitride, and if the material of the first spacer 125 and the first merged spacer 127 is silicon oxide or silicon nitride, the material of the second spacer 135 and the second merged spacer 137 is polycrystalline silicon. In the second embodiment, the width of the second merged spacer 137 corresponds to the foregoing width W2 of the patterned mandrel 120 closest to the select gate region 102 in the word line region 101.

Figure 12:
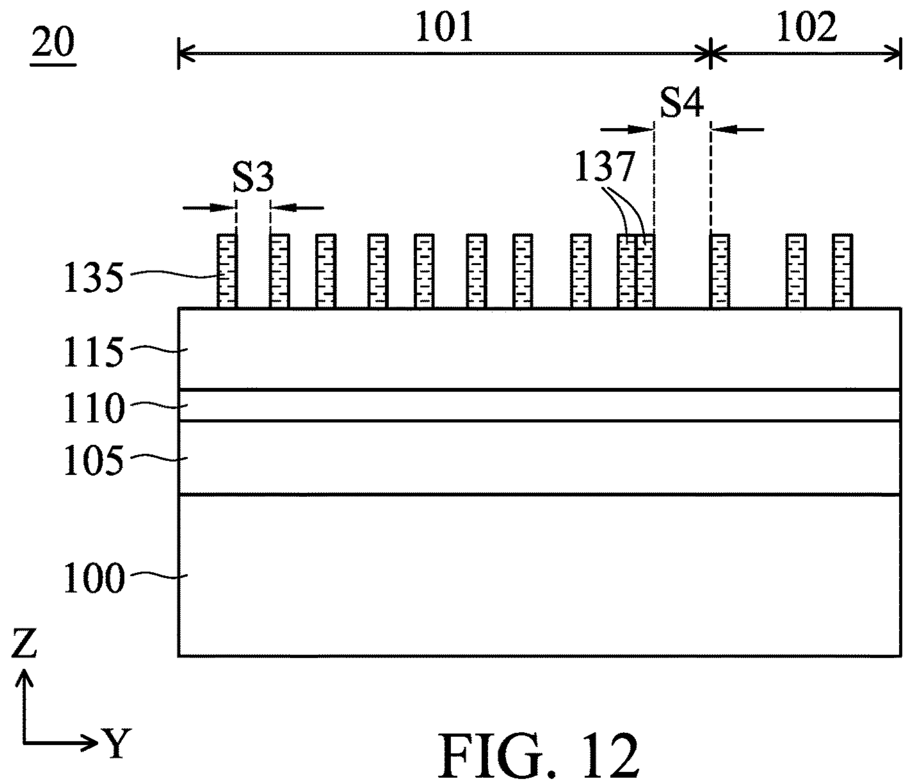

Referring to FIG. 12, the first spacer 125 and the first merged spacer 127 are selectively removed to leave the second spacer 135 and the second merged spacer 137 on the hard mask layer 115. The second spacer 135 and the second merged spacer 137 in the word line region 101 correspond to the subsequently formed word lines 200 and the subsequently formed first word line 200', respectively. The first spacer 125 and the first merged spacer 127 may be removed by using etching process, stripping process, ashing process, or a combination thereof, as previously described. Compared to the first embodiment, the second embodiment using the SAQP process is able to form a spacer pattern with smaller spacing, thereby allowing for subsequent formation of the word lines 200 with smaller line widths and line spacing. In the second embodiment, after selectively removing the first spacer 125 and the first merged spacer 127, a third spacing S3 is between the second spacer 135 in the word line region 101 that remains on the hard mask layer 115. The third spacing S3 is substantially the third spacing S3 between the word lines 200 subsequently formed in the word line region 101. A fourth spacing S4 is between the second merged spacer 137 and the second spacer 135 in the select gate region 102 closest to the boundary between the word line region 101 and the select gate region 102. The fourth spacing S4 is substantially the second spacing S2 between the subsequently formed first word line 200' and the select gate 300. The ratio of the width of the second merged spacer 137 to the width of the second spacer 135 is greater than 1 but not greater than 2.

Figure 13:
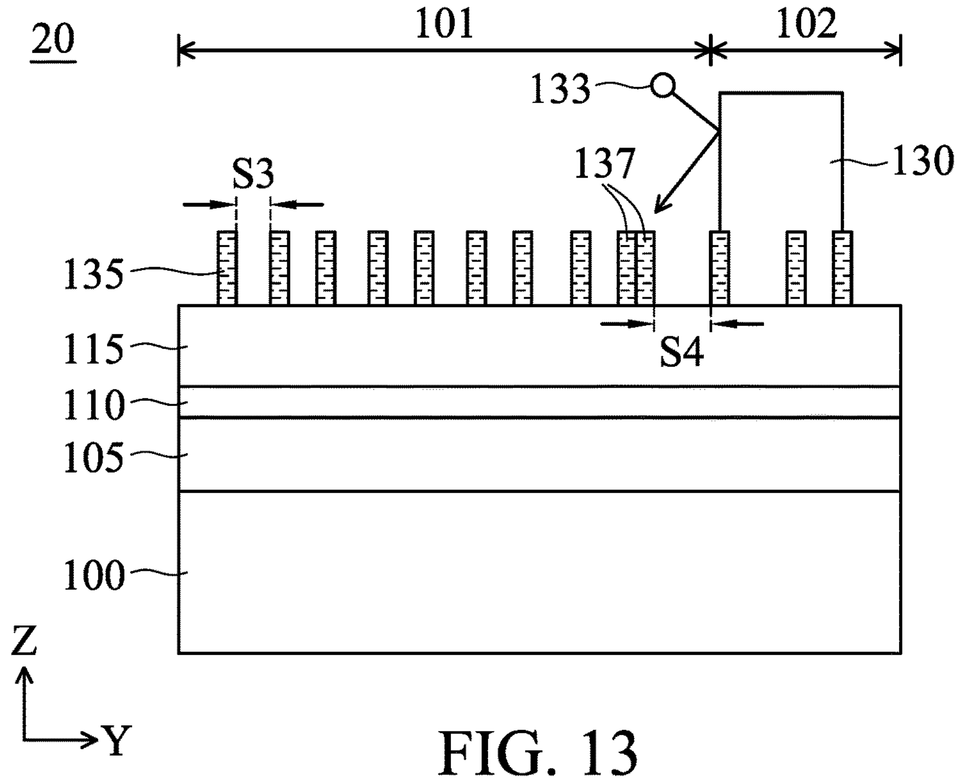

Referring to FIG. 13, a patterned photoresist 130 is formed over the select gate region 102. The patterned photoresist 130 may be used to define a pattern of the subsequently formed select gate 300 in the select gate region 102. In some embodiments, the patterned photoresist 130 may partially cover the second spacer 135 closest to the word line region on the select gate region 102 and expose a portion of this second spacer 135. This helps to improve the alignment shifting that may occur between the patterned photoresist 130 and the second spacer 135 due to pattern overlap, thereby ensuring that the select gate 300 may be formed to the desired width. The distance between the patterned photoresist 130 and the second merged spacer 137 may be substantially equal to the fourth spacing S4. The height of the patterned photoresist 130 is greater than the height of the second spacer 135 and the height of the second merged spacer 137. This helps to reduce etching damage to the second spacer 135 and the second merged spacer 137 during the formation of the patterned photoresist 130.

Furthermore, as described above, in the subsequent pattern transfer process, the plasma ions 133 may be reflected and bombard the second merged spacer 137 by the sidewalls of the patterned photoresist 130, causing the second merged spacer 137 (i.e., corresponding to the pattern that is subsequently formed into the first word line 200') to be subjected to an additional bombardment of ions. However, in embodiments of the present disclosure, a second merged spacer 137 with a larger width is formed by controlling the distance between the first spacer 125' and the first merged spacer 127 (i.e., the width W2 that corresponds to the width of the patterned mandrel 120 closest to the select gate 102 in the word line region 101). This may increase the process window for the second merged spacer 137 to be bombarded by the plasma ions 133, maintaining the integrity of the pattern of the first word line 200'. Additionally, in the second embodiment, the distance (e.g., the fourth spacing S4) between the second merged spacer 137 and the patterned photoresist 130 is increased by increasing the width of the first merged spacer 127 (i.e., corresponding to the distance d3 between the two closest patterned mandrels 120 at the intersection of the word line region 101 and the select gate region 102). This helps reduce the possibility of the plasma ions 133 bombarding the second merged spacer 137, thereby maintaining the pattern integrity of the first word line 200'.

Figure 14:
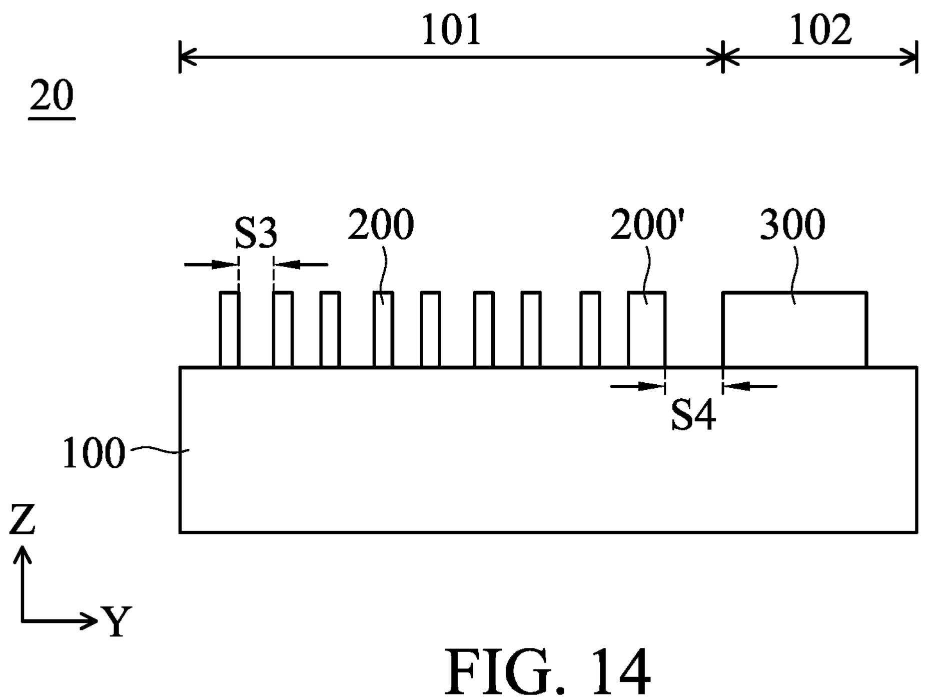

Referring to FIGS. 13 and 14, using the second spacer 135, the second merged spacer 137, and the patterned photoresist 130 as a mask, the patterns of the second spacer 135 and the second merged spacer 137 are sequentially transferred to the hard mask layer 115 and the stack layer 105 to form the word lines 200 and the first word line 200'. In addition, the pattern of the patterned photoresist 130 is sequentially transferred to the hard mask layer 115 and the stack layer 105 to form the select gate 300. The first word line 200' is the first word line of the word lines 200 closest to the select gate 300. In other words, the portion of the stack layer 105 that corresponds to the second spacer 135 and the second merged spacer 137 in the word line region 101 is formed as the word lines 200 and the first word line 200', respectively, and the portion of the stack layer 105 that corresponds to the patterned photoresist 130 in the select gate region 102 is formed as the select gate 300. A third spacing S3 is between the word lines 200, and the third spacing S3 may correspond to the spacing between the second spacer 135 in the word line region 101, and may correspond to the width of the first spacer 125 in the word line region 101. A fourth spacing S4 is between the first word line 200' and the select gate 300, the first word line 200' is the word lines 200 closest to the select gate 300. The fourth spacing S4 may correspond to the width of the first merged spacer 127, and may also correspond to the distance d3 between the two closest patterned mandrels 120 at the intersection of the word line region 101 and the select gate region 102. In some embodiments, the fourth spacing S4 is greater than the third spacing S3. The width of the first word line 200' is greater than the width of any of the other word lines 200. The width of the first word line 200' is equal to the fourth spacing S4. The first word line 200' and the select gate 300 are separated by the width of the first merged spacer 127.

Referring to FIG. 7 described above for the first embodiment, as previously described, similar to the semiconductor structure 10, the semiconductor structure 20 may continue to perform semiconductor processes such as various deposition, lithography, etching, and the like. Subsequent processes may be used to form other related features of the memory device such as the capacitor contact window, the bit line, and the like, which will not be described further herein.

In summary, compared to conventional patterning processes, the embodiments of the present disclosure increase the width of the first word line closest to the select gate by varying the spacing of the patterned mandrels to further control the formation of the merged spacer. This increases the width of the first word line closest to the select gate and increases the spacing between the word line and the select gate by varying the width of the patterned mandrel or the width of the merged spacer to avoid possible breakage or other damage to the first word line. Thus, the various embodiments described herein offer several advantages over the existing art. It will be understood that not all advantages have been necessarily discussed herein, no particular advantage is required for all embodiments, and other embodiments may offer different advantages.

What is claimed is:

1. A method for forming a semiconductor structure, comprising:

providing a substrate with a word line region and a select gate region adjacent to each other;

sequentially forming a stack layer and a hard mask layer on the substrate;

forming a plurality of patterned mandrels on the hard mask layer, wherein a distance between two closest ones of the plurality of patterned mandrels at an intersection of the word line region and the select gate region is less than a distance between the plurality of patterned mandrels in the word line region;

forming a plurality of sidewall spacers on opposite sidewalls of the plurality of patterned mandrels;

forming a patterned photoresist over the select gate region; and using the plurality of sidewall spacers and the patterned photoresist as a mask, sequentially patterning the hard mask layer and the stack layer to form a plurality of word lines in the word line region and a select gate in the select gate region, respectively, wherein the plurality of word lines extend in a first direction and are arranged in a second direction, wherein a first spacing is a distance between adjacent word lines of the plurality of word lines in the second direction, wherein a second spacing is a distance between the select gate and a first word line of the plurality of word lines closest to the select gate in the second direction, and wherein the second spacing is greater than the first spacing.

2. The method as claimed in claim 1, wherein the forming of the plurality of sidewall spacers comprises:

forming a plurality of first spacers on the opposite sidewalls of the plurality of patterned mandrels, and forming a first merged spacer between the two closest ones of the plurality of patterned mandrels adjacent to the word line region and the select gate region;

removing the plurality of patterned mandrels to leave the plurality of first spacers and the first merged spacer on the hard mask layer; and sequentially transferring a pattern of the plurality of first spacers and the first merged spacer to the hard mask layer and the stack layer to form the plurality of word lines and the select gate, wherein a portion of the stack layer corresponding to the plurality of first spacers and the first merged spacer in the word line region is formed as the plurality of word lines and the first word line, respectively, and wherein a portion of the stack layer corresponding to the patterned photoresist in the select gate region is formed as the select gate.

3. The method as claimed in claim 2, wherein a ratio of a width of the first merged spacer in the second direction to a width of the plurality of first spacers in the second direction is greater than 1 but not greater than 2.

4. The method as claimed in claim 2, wherein a height of the patterned photoresist is greater than a height of the plurality of first spacers and a height of the first merged spacer.

5. The method as claimed in claim 2, wherein a width of the first word line in the second direction is greater than a width of any other one of the plurality of word lines in the second direction.

6. The method as claimed in claim 1, wherein the forming of the plurality of sidewall spacers comprises:

forming a plurality of first spacers on the opposite sidewalls of the plurality of patterned mandrels, and forming a first merged spacer between the two closest ones of the plurality of patterned mandrels adjacent to the word line region and the select gate region;

removing the plurality of patterned mandrels to leave the plurality of first spacers and the first merged spacer on the hard mask layer;

forming a plurality of second spacers on opposing sidewalls of the plurality of first spacers and the first merged spacer, and forming a second merged spacer between the first merged spacer and a closest one of the plurality of first spacers in the word line region;

removing the plurality of first spacers and the first merged spacer to leave the plurality of second spacers and the second merged spacer on the hard mask layer; and sequentially transferring a pattern of the plurality of second spacers and the second merged spacer to the hard mask layer and the stack layer to form the plurality of word lines and the select gate, wherein a portion of the stack layer corresponding to the plurality of second spacers and the second merged spacer in the word line region is formed as the plurality of word lines and the first word line, respectively, and wherein a portion of the stack layer corresponding to the patterned photoresist in the select gate region is formed as the select gate.

7. The method as claimed in claim 6, wherein a ratio of a width of the second merged spacer in the second direction to a width of the plurality of second spacers in the second direction is greater than 1 but not greater than 2.

8. The method as claimed in claim 6, wherein a height of the patterned photoresist is greater than a height of the plurality of second spacers and a height of the second merged spacer.

9. The method as claimed in claim 6, wherein the first word line is separated from the select gate by a width of the first merged spacer in the second direction.

10. The method as claimed in claim 6, wherein a width of the first merged spacer in the second direction is equal to a width of the second merged spacer in the second direction.

11. The method as claimed in claim 6, wherein the patterned photoresist exposes a portion of the plurality of second spacers.

12. The method as claimed in claim 1, wherein before the forming of the hard mask layer on the stack layer, the method further comprises:

forming a sacrificial layer on the stack layer, wherein the sacrificial layer protects the stack layer from etching during the transferring of the pattern of the plurality of second spacers and the second merged spacer to the hard mask layer, wherein the hard mask layer comprises polycrystalline silicon, and wherein the sacrificial layer comprises silicon oxide.

13. The method as claimed in claim 1, wherein a width of the first word line in the second direction is equal to the second spacing.

14. A semiconductor structure, comprising:

a substrate;

a plurality of word lines disposed on the substrate, wherein the plurality of word lines extend in a first direction and are arranged in a second direction, and wherein the first direction intersects the second direction; and a select gate disposed on the substrate, adjacent to and spaced apart from the plurality of word lines in the second direction, wherein a first spacing is a distance between adjacent word lines of the plurality of word lines in the second direction, wherein a second spacing is a distance between the select gate and a first word line of the plurality of word lines closest to the select gate in the second direction, wherein the second spacing is greater than the first spacing, and wherein a width of the first word line in the second direction is greater than the first spacing.

15. The semiconductor structure as claimed in claim 14, wherein the width of the first word line in the second direction is greater than a width of any other one of the plurality of word lines in the second direction.

16. The semiconductor structure as claimed in claim 14, wherein the width of the first word line in the second direction is equal to the second spacing.

17. The semiconductor structure as claimed in claim 14, wherein a ratio of the width of the first word line in the second direction to a width of any other one of the plurality of word lines in the second direction is greater than 1 but not greater than 2.

18. The semiconductor structure as claimed in claim 14, wherein a ratio of the second spacing to a width of any other one of the plurality of word lines other than the first word line in the second direction is greater than 1 but not greater than 2.

19. The semiconductor structure as claimed in claim 14, wherein a ratio of the second spacing to the first spacing is greater than 1 but not greater than 2.

20. The semiconductor structure as claimed in claim 14, wherein a ratio of the width of the first word line in the second direction to the first spacing is greater than 1 but not greater than 2.

* * * * *